US008766429B2

(12) United States Patent
Kim

(10) Patent No.: US 8,766,429 B2
(45) Date of Patent: Jul. 1, 2014

(54) SEMICONDUCTOR PACKAGES

(71) Applicant: Samsung Electronics Co., Ltd., Suwon-si (KR)

(72) Inventor: Yonghoon Kim, Hwasung (KR)

(73) Assignee: Samsung Electronics Co., Ltd., Suwon-Si. Gyeonggi-Do (KR)

( * ) Notice: Subject to any disclaimer, the term of this patent is extended or adjusted under 35 U.S.C. 154(b) by 23 days.

(21) Appl. No.: 13/660,424

(22) Filed: Oct. 25, 2012

(65) Prior Publication Data

US 2013/0214396 A1    Aug. 22, 2013

(30) Foreign Application Priority Data

Feb. 16, 2012  (KR) .................. 10-2012-0015847

(51) Int. Cl.
  *H01L 23/552* (2006.01)
  *H01L 23/48* (2006.01)
  *H01L 23/52* (2006.01)
(52) U.S. Cl.
  USPC ........... 257/692; 257/659; 257/690; 257/712; 438/107; 438/122
(58) Field of Classification Search
  USPC ........... 257/659, 690, 692, 712; 438/107, 122
  See application file for complete search history.

(56) References Cited

U.S. PATENT DOCUMENTS

| | | | |
|---|---|---|---|
| 6,297,551 B1 * | 10/2001 | Dudderar et al. ............. | 257/723 |
| 6,521,978 B2 * | 2/2003 | Fenk et al. .................... | 257/659 |
| 7,208,825 B2 | 4/2007 | Pu et al. | |
| 7,683,469 B2 | 3/2010 | Oh et al. | |
| 7,741,567 B2 | 6/2010 | Beddingfield et al. | |
| 7,851,894 B1 | 12/2010 | Scanlan | |
| 2007/0246813 A1 | 10/2007 | Ong et al. | |
| 2008/0108179 A1 | 5/2008 | Mistry et al. | |
| 2009/0194851 A1 * | 8/2009 | Chiu et al. .................... | 257/660 |
| 2009/0302439 A1 * | 12/2009 | Pagaila et al. ................ | 257/660 |
| 2010/0133534 A1 * | 6/2010 | Do et al. ......................... | 257/48 |
| 2010/0140759 A1 * | 6/2010 | Pagaila et al. ................ | 257/660 |
| 2011/0147901 A1 | 6/2011 | Huang et al. | |
| 2011/0227209 A1 | 9/2011 | Yoon et al. | |
| 2012/0086109 A1 * | 4/2012 | Kim et al. ..................... | 257/659 |

FOREIGN PATENT DOCUMENTS

KR    1020070076084    7/2007

* cited by examiner

*Primary Examiner* — Karen Kusumakar
(74) *Attorney, Agent, or Firm* — F. Chau & Associates, LLC

(57) ABSTRACT

A semiconductor package includes a first package including a first wiring board and at least one first semiconductor chip mounted on the first wiring board, a second package stacked on the first package. The second package includes a second wiring board and at least one second semiconductor chip mounted on the second wiring board. The semiconductor package further includes at least one connection terminal connecting a plurality of signal lines of the first and second wiring boards, respectively, with each other. The semiconductor package further includes at least one ground terminal connecting a plurality of ground lines of the first and second wiring boards, respectively, with each other, and includes a side surface, and a shielding member covering a top surface and a side surface of a structure including the first and second packages and the shielding member is disposed on the at least one ground terminal.

20 Claims, 5 Drawing Sheets

SEMICONDUCTOR PACKAGES

CROSS-REFERENCE TO RELATED APPLICATIONS

This application claims priority to Korean Patent Application No. 10-2012-0015847, filed on Feb. 16, 2012, the disclosure of which is hereby incorporated by reference herein in its entirety.

TECHNICAL FIELD

Example embodiments of the inventive concept relate to a semiconductor package, and more particularly, to a semiconductor package with package-on-package structure.

DISCUSSION OF THE RELATED ART

There is a growing trend to fabricate lightweight, small-sized, high speed, multifunctional, high performance, and low-cost electronic systems. In response to such a trend, multi-chip stacked package techniques and/or system in package techniques have been proposed.

In a multi-chip stacked package or a system in package, one or more functions of a plurality of semiconductor devices may be performed in a single semiconductor package. A multi-chip stacked package or a system in package may have a thicker thickness compared to a single chip package but may have a similar size to the single chip package in terms of a planar surface area or 'footprint'. Thus, a multi-chip stacked package or a system in package may be used in small and/or mobile devices with high performance requirements such as, for example, mobile phones, notebook computers, memory cards, and/or portable camcorders.

Electronic devices or systems may be suffer from electromagnetic interference (EMI), which may result from a radiated emission (RE) or a conducted emission (CE) unnecessarily occurring in the electronic devices. For example, the electromagnetic interference may disturb the operation of other electronic devices adjacent thereto, thereby deteriorating overall performance of the device or causing the malfunctioning of the device.

SUMMARY

Example embodiments of the inventive concept may provide a semiconductor package with increased operational reliability.

According to an example embodiment of the inventive concepts, a semiconductor package may include a first package including a first wiring board and at least one first semiconductor chip mounted on the first wiring board, and a second package stacked on the first package. The second package includes a second wiring board and at least one second semiconductor chip mounted on the second wiring board. The semiconductor package further includes at least one connection terminal connecting a plurality of signal lines, which may be disposed in the first and second wiring boards, respectively, with each other, and thereby electrically connecting the first package to the second package, at least one ground terminal connecting a plurality of ground lines, which may be disposed in the first and second wiring boards, respectively, with each other, and which includes a side surface, and a shielding member covering a top surface and a side surface of a structure including the first and second packages and the shielding member is disposed on the at least one ground terminal.

In an example embodiment, the first and second packages have the same occupying area, in a plan view.

In an example embodiment, the ground lines of the first and second wiring boards may be exposed at outer edges of the first and second wiring boards, respectively, and may be in direct contact with the shielding member.

In an example embodiment, the shielding member may be a metal layer.

In an example embodiment, the shielding member may include a soft magnetic material. The shielding member may include an adhesion layer, a soft magnetic layer, and a metal layer, the adhesion layer may include a conductive material, and the soft magnetic material may include iron oxides and one of nickel, zinc, manganese, cobalt, magnesium, aluminum, barium, copper, iron, or any combination thereof.

In an example embodiment, the at least one connection terminal may be provided in a form of a solder ball, and the at least one ground terminal may be in a form of a solder ball shaped substantially the same as a partial structure of the solder ball of the at least one connection terminal along a direction perpendicular to a surface of the first wiring board.

In an example embodiment, the package may further include a first molding layer covering a top surface of the first wiring board. The at least one connection terminal may be shaped like a pillar and penetrate the first molding layer, and the at least one ground terminal may be shaped like a pillar and penetrate the first molding layer and is exposed at the outer edge between the first and second wiring boards. The package may further include an adhesion layer interposed between the first package and the second package.

In an example embodiment, the package may further include a second molding layer covering a top surface of the second wiring board.

In an example embodiment, the package may further include at least one solder ball disposed on a bottom surface of the first wiring board.

In an example embodiment, the package may further include a heat dissipating member on the shielding member.

According to an example embodiment of the inventive concept, a semiconductor package may include a first package including a first wiring board and at least one first semiconductor chip mounted on the first wiring board and a second package stacked on the first package. The second package includes a second wiring board and at least one second semiconductor chip mounted on the second wiring board. The semiconductor package further includes at least one ground terminal connecting ground lines, which may be disposed in the first and second wiring boards, respectively, with each other, and includes a side surface exposed at an outer edge between the first and second wiring boards, and a shielding member covering a top surface and a side surface of a structure including the first and second packages and the shielding member is in direct contact with the at least one ground terminal.

In example embodiments, the ground lines of the first and second wiring boards may be exposed at outer edges of the first and second wiring boards, respectively, and may be in direct contact with the shielding member.

According to an example embodiment of the inventive concept, a semiconductor package is provided. The semiconductor package includes a first package including a lower wiring board and at least one first semiconductor chip mounted on and electically connected to the lower wiring board via a chip mounting solder ball and an underfill. The lower wiring board includes a signal line and a ground line.

The semiconductor package further includes a second package stacked on the first package, and the second package includes an upper wiring board and at least one second semiconductor chip mounted on and electrically connected to the upper wiring board by a bonding wire and an adhesion layer disposed between the at least one second semiconductor chip and the upper wiring board. The upper wiring board includes a signal line and a ground line.

In addition, the semiconductor package further includes at least one connection terminal disposed between the lower and upper wiring boards which connects the signal line of the lower wiring board with the signal line of the upper wiring board, at least one ground terminal disposed between the lower and upper wiring boards which connects the ground line of the lower wiring board with the ground line of the upper wiring board. The at least one first semiconductor chip is electrically connected to the ground terminal via the chip mounting solder ball and the ground line of the lower wiring board and the at least one second semiconductor chip is electrically connected to the at least one ground terminal via a ground bonding wire and the ground line of the upper wiring board.

Moreover, the semiconductor package further includes a shielding member covering a top surface and a side surface of a structure including the first and second packages and the shielding member is disposed on a side of the at least one ground terminal.

BRIEF DESCRIPTION OF THE DRAWINGS

Example embodiments of the inventive concept can be more clearly understood from the following detailed description taken in conjunction with the accompanying drawings.

FIG. 1 is a sectional view illustrating a semiconductor package according to an example embodiment of the inventive concept.

FIG. 2 is a sectional view illustrating a semiconductor package according to an example embodiment of the inventive concept.

FIG. 3 is a plan view illustrating a package module according to an example embodiment of the inventive concept.

FIG. 4 is a block diagram illustrating a memory card according to an example embodiment of the inventive concept.

FIG. 5 is a block diagram illustrating an electronic system according to an example embodiment of the inventive concept FIG. 6 is a perspective view illustrating an electron apparatus according to an example embodiment of the inventive concept.

DETAILED DESCRIPTION

Figure 1:
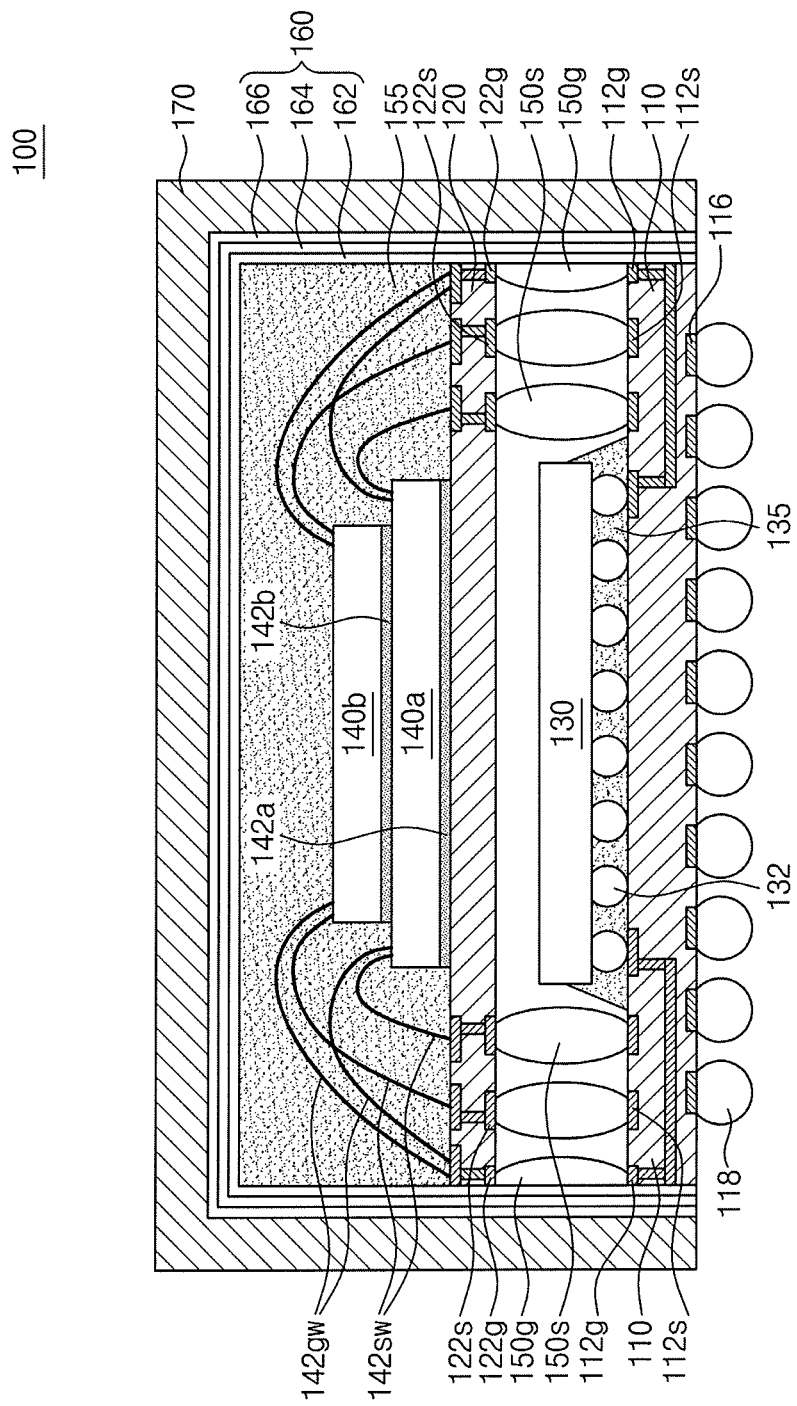
FIGS. 1 through 6 represent a non-limiting, example embodiment as described herein.

Example embodiments of the inventive concept will now be described more fully with reference to the accompanying drawings, in which example embodiments are shown. Example embodiments of the inventive concepts may, however, be embodied in many different forms and should not be construed as being limited to embodiments set forth herein. In the drawings, the thicknesses of layers and regions may be exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

FIG. 1 is a sectional view illustrating a semiconductor package according to an example embodiment of the inventive concept.

Referring to FIG. 1, a semiconductor package 100 may include, for example, a lower package, an upper package, at least one connection terminal 150s, at least one ground terminal 150g, and a shielding member 160. The lower package may include, for example, a lower wiring board 110 and at least one lower semiconductor chip 130 mounted on the lower wiring board 110, and the upper package may include an upper wiring board 120 and at least one upper semiconductor chip 140a or 140b mounted on the upper wiring board 120. In an example embodiment, the lower wiring board 110 may include, for example, at least one signal line 112s and at least one ground line 112g, and the upper wiring board 120 may include, for example, at least one signal line 122s and at least one ground line 122g. The connection terminal 150s may be disposed between the lower and upper wiring boards 110 and 120 to connect the signal line 112s of the lower wiring board 110 with the signal line 122s of the upper wiring board 120, and the ground terminal 150g may be disposed between the lower and upper wiring boards 110 and 120 to connect the ground line 112g of the lower wiring board 110 with the ground line 122g of the upper wiring board 120. In an example embodiment, a side surface of the ground terminal 150g may be, for example, outwardly exposed at an outer edge between the lower and upper wiring boards 110 and 120. The shielding member 160 may be, for example, in direct contact with the ground terminal 150g.

In an example embodiment, the connection terminal 150s may be configured to have, for example, a solder ball structure, and the ground terminal 150g may be configured to have a solder ball structure cut along a direction perpendicular to a surface of the lower wiring board 110. In other words, the ground terminal 150g may be shaped to include a cutting surface exposed at the outer edge between the lower and upper wiring boards 110 and 120. The cutting surface may be formed, for example, by vertically cutting a normal solder ball, which may be used to connect the ground lines 112g and 122g of the lower and upper wiring boards 110 and 120, in a cutting process. The semiconductor package 100 may be one of the pieces separated by the cutting process.

In an example embodiment, the semiconductor package 100 may be provided, for example, in the form of a package-on-package (PoP) structure, in which the upper package is stacked on the lower package. The lower and upper packages may have, for example, the same occupying area, in a plan view. The shielding member 160 may cover, for example, a top surface and a side surface of a structure including the lower and upper packages and be in direct contact with the exposed side surface of the ground terminal 150g. In an example embodiment, the semiconductor package 100 may further include, for example, an upper molding layer 155 provided on the upper wiring board 120 and covered by the shielding member 160. The upper molding layer 155 may include, for example, an epoxy molding compound (EMC).

Each of the lower and upper wiring boards 110 and 120 may include, for example, a plurality of interconnection lines, e.g., ground lines 112$g$ and 122$g$ and signal lines 112$s$ and 122$s$. In an example embodiment, at least one of the lower and upper wiring boards 110 and 120 may be, for example, a printed circuit board (PCB). In an example embodiment, at least one of the lower and upper wiring boards 110 and 120 may be, for example, a semiconductor substrate (e.g., a silicon substrate, a silicon-germanium substrate, or a silicon-on-insulator (SOI) substrate). Each of the interconnection lines, e.g., ground lines 112$g$ and 122$g$ and signal lines 112$s$ and 122$s$ may include, for example, a conductive material. At least one of the signal lines 112$s$ and 122$s$ may be coupled with a power voltage, and the ground lines 112$g$ and 122$g$ may be coupled with a ground voltage.

In an example embodiment, the lower and upper wiring boards 110 and 120 may have, for example, the same occupying area, in a plan view. The ground lines 112$g$ and 122$g$ may be, for example, exposed at outer edges of the lower and upper wiring boards 110 and 120, respectively. Accordingly, all or either of the ground lines 112$g$ and 122$g$ may be, for example, in direct contact with the shielding member 160.

The lower semiconductor chip 130 and the upper semiconductor chip 140$a$ or 140$b$ may be mounted and electrically connected to the lower and upper wiring boards 110 and 120, respectively, using, for example, a flip chip (F/C) bonding technique and/or a wire bonding technique. In an example embodiment, the lower semiconductor chip 130 may be mounted on and electrically connected to the lower wiring board 110 using, for example, chip mounting solder balls 132 and an underfill 135 in a flip chip bonding manner, and the upper semiconductor chips 140$a$ and 140$b$ may be mounted on and electrically connected to the upper wiring board 120 using, for example, adhesion layers 142$a$ and 142$b$ and bonding wires 142$sw$ in a wire bonding manner, but example embodiments of the inventive concept may not be limited thereto. The lower semiconductor chip 130 and the upper semiconductor chip 140$a$ or 140$b$ may be, for example, a volatile memory device (e.g., a dynamic random access memory (DRAM) and a static RAM (SRAM)), a nonvolatile memory device (e.g., FLASH memory device), a photoelectron device, a logic device, a communication device, a digital signal processor (DSP), or a system-on-chip (SOC).

The lower semiconductor chip 130 may be electrically connected to the ground terminal 150$g$ using, for example, the chip mounting solder ball 132 and the ground line 112$g$ of the lower wiring board 110. The upper semiconductor chip 140$a$ or 140$b$ may be electrically connected to the ground terminal 150$g$ using, for example, a ground bonding wire 142$gw$ and the ground line 122$g$ of the upper wiring board 120. The above-mentioned connections allow for a reduction of electromagnetic interference in the semiconductor package 100. In other words, electromagnetic interference in the lower and upper semiconductor chips 130, 140$a$, and 140$b$ can be suppressed by the ground line 112$g$, the ground terminal 150$g$, and the shielding member 160 electrically connected to the lower and upper semiconductor chips 130, 140$a$, and 140$b$. In addition, electromagnetic interference from the exterior can be prevented by the shielding member 160 being in direct contact with the ground line 112$g$ and/or the ground terminal 150$g$.

The shielding member 160 may be, for example, shaped like a can and include a metal layer or a soft magnetic material. In the case in which the shielding member 160 is formed of a metal layer, the shielding member 160 may be formed using, for example, an electroplating technique. In an example embodiment, the shielding member 160 may be, for example, in direct contact with the ground terminal 150$g$ through the metal layer formed by the electroplating technique. Alternatively, in the case in which the shielding member 160 is a can formed of a soft magnetic material, the shielding member 160 may include, for example, an adhesion layer 162, a soft magnetic layer 164 and a metal layer 166, and the adhesion layer 162 may include a conductive material. In this case, the shielding member 160 may be, for example, in direct contact with the ground terminal 150$g$ through the adhesion layer 162 including the conductive material.

The soft magnetic material may be, for example, a soft magnetic metal powder or a soft magnetic alloy powder. The soft magnetic material may include, for example, a ferrite material exhibiting high resistivity and low saturation magnetization. In an example embodiment, the ferrite material may include, for example, iron oxides (e.g., FeO, $Fe_2O_3$, $Fe_2O_4$, and $Fe_3O_4$) and at least one metal. The metal constituting the ferrite material in conjunction with the iron oxides may include, for example, one selected from the group consisting of nickel (Ni), zinc (Zn), manganese (Mn), cobalt (Co), magnesium (Mg), aluminum (Al), barium (Ba), copper (Cu), iron (Fe), or any combination thereof.

The semiconductor package 100 may include, for example, at least one package mounting solder ball 118 provided on a connection pad 116 on a bottom surface of the lower wiring board 110. The package mounting solder ball 118 may be used to mount and electrically connect the semiconductor package 100 to, for example, a mother board.

The semiconductor package 100 may further include, for example, a heat dissipating member 170 provided on the shielding member 160. The heat dissipating member 170 may be, for example, a heat slug. The heat dissipating member 170 may be provided on the shielding member 160 to emit heat generated from the semiconductor package 100 to the exterior. As shown, the heat dissipating member 170 may be, for example, in direct contact with the shielding member 160. Alternatively, the heat dissipating member 170 may be provided spaced apart from the shielding member 160 by a predetermined interval.

Figure 2:
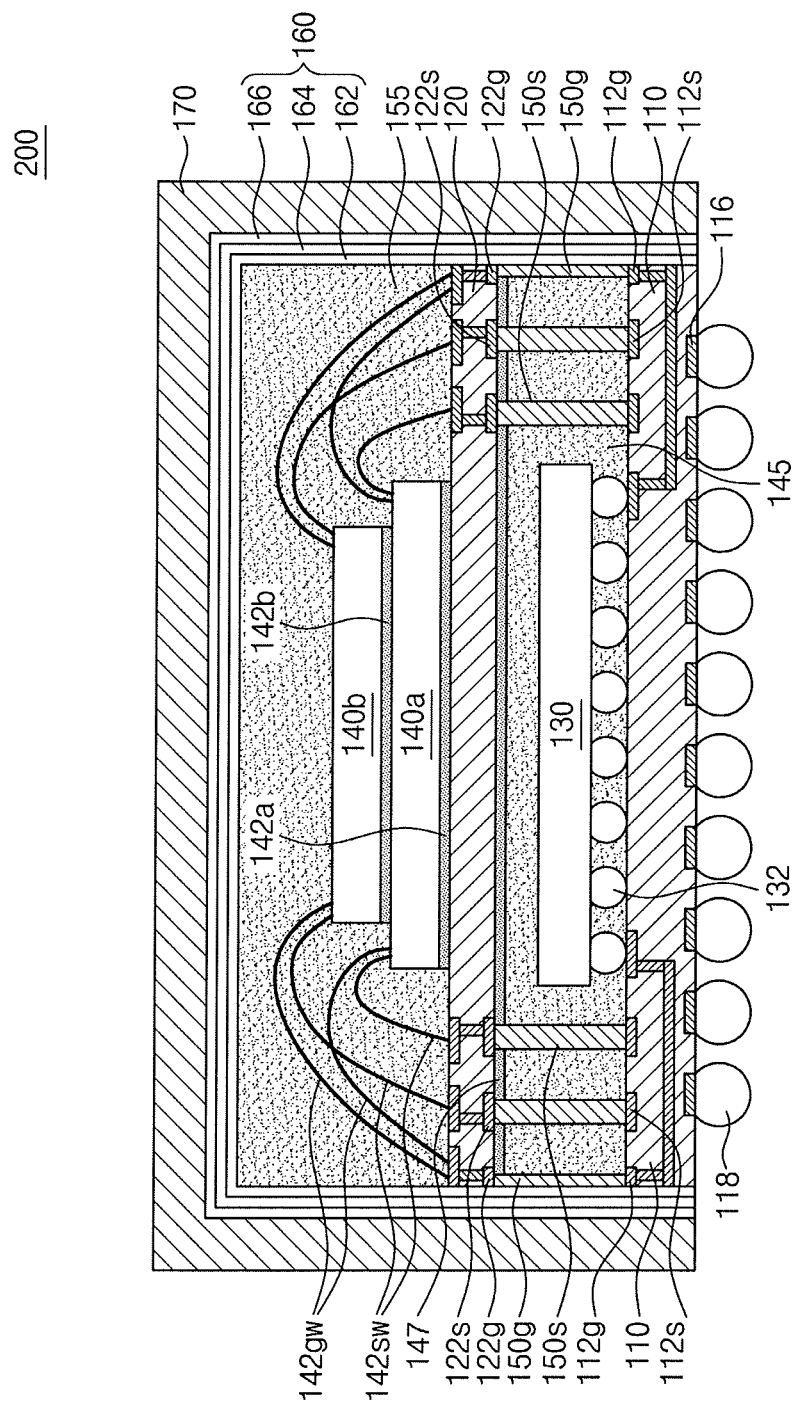

FIG. 2 is a sectional view illustrating a semiconductor package according to an example embodiment of the inventive concept.

Referring to FIG. 2, a semiconductor package 200 may include, for example, a lower package, an upper package, at least one connection terminal 150$s$, at least one ground terminal 150$g$, and a shielding member 160. The lower package may include, for example, a lower wiring board 110 and at least one lower semiconductor chip 130 mounted on the lower wiring board 110, and the upper package may include, for example, an upper wiring board 120 and at least one upper semiconductor chip 140$a$ or 140$b$ mounted on the upper wiring board 120. In an example embodiment, the lower wiring board 110 may include at least one signal line 112$s$ and at least one ground line 112$g$, and the upper wiring board 120 may include, for example, at least one signal line 122$s$ and at least one ground line 122$g$. The connection terminal 150$s$ may be disposed between the lower and upper wiring boards 110 and 120 to connect the signal line 112$s$ of the lower wiring board 110 with the signal line 122$s$ of the upper wiring board 120, and the ground terminal 150$g$ may be disposed between the lower and upper wiring boards 110 and 120 to connect the ground line 112$g$ of the lower wiring board 110 with the ground line 122$g$ of the upper wiring board 120. In an example embodiment, a side surface of the ground terminal 150g may be, for example, outwardly exposed at an outer edge between the lower and upper wiring boards 110 and 120. The shielding member 160 may be, for example, in direct contact with the ground terminal 150g.

In an example embodiment, the semiconductor package 200 may be provided in a form of a package-on-package (PoP) structure, in which the upper package is stacked on the lower package. The lower and upper packages may have, for example, the same occupying area, in a plan view. The shielding member 160 may, for example, cover a top surface and a side surface of a structure including the lower and upper packages and be in direct contact with the exposed side surface of the ground terminal 150g. In an example embodiment, the semiconductor package 200 may further include, for example, a lower molding layer 145 covering the lower wiring board 110 and the lower semiconductor chip 130 mounted on the lower wiring board 110 and an upper molding layer 155 provided on the upper wiring board 120 and covered by the shielding member 160. The lower and upper molding layers 145 and 155 may include, for example, an epoxy molding compound (EMC). Here, the semiconductor package 200 may include, for example, an adhesion layer 147 interposed between the lower and upper packages. The adhesion layer 147 may include, for example, an insulating adhesive material and be penetrated by the connection and ground terminals 150s and 150g.

The connection terminal 150s may be shaped, for example, like a pillar and penetrate lower molding layer 145. The ground terminal 150g may penetrate the lower molding layer 145 and have a cutting surface exposed outwardly between the lower and upper wiring boards 110 and 120. The connection terminal 150s and the ground terminal 150g may be formed by, for example, performing a laser drilling process to form holes penetrating the lower molding layer 145 and then filling the holes with a conductive material. The exposed cutting surface of the ground terminal 150g may be formed by, for example, vertically cutting a normal pillar, which may be used to connect the ground lines 112g and 122g of the lower and upper wiring boards 110 and 120, in a cutting process. The semiconductor package 200 may be one of the pieces separated by the cutting process.

Each of the lower and upper wiring boards 110 and 120 may include, for example, a plurality of interconnection lines, e.g., ground lines 112g and 122g and signal lines 112s and 122s. In an example embodiment, at least one of the lower and upper wiring boards 110 and 120 may be, for example, a PCB. Alternatively in an example embodiment, at least one of the lower and upper wiring boards 110 and 120 may be, for example, a semiconductor substrate (e.g., a silicon substrate, a silicon-germanium substrate, or a SOI substrate). Each of the interconnection lines, e.g., ground lines 112g and 122g and signal lines 112s and 122s may include, for example, a conductive material. At least one of the signal lines 112s and 122s may be coupled with a power voltage, and the ground lines 112g and 122g may be coupled with a ground voltage.

In an example embodiment, the lower and upper wiring boards 110 and 120 may have, for example, the same occupying area, in a plan view. The ground lines 112g and 122g may be, for example, exposed at outer edges of the lower and upper wiring boards 110 and 120, respectively. Accordingly, all or either of the ground lines 112g and 122g may be, for example, in direct contact with the shielding member 160.

The lower semiconductor chip 130 and the upper semiconductor chip 140a or 140b may be mounted on and electrically connected to the lower and upper wiring boards 110 and 120, respectively, using, for example, a flip chip bonding technique and/or a wire bonding technique. In an example embodiment, the lower semiconductor chip 130 may be mounted on and electrically connected to the lower wiring board 110 using, for example, chip mounting solder balls 132 in a flip chip bonding manner, and the upper semiconductor chips 140a and 140b may be mounted on and electrically connected to the upper wiring board 120 using, for example, adhesion layers 142a and 142b and bonding wires 142sw in a wire bonding manner, but example embodiments of the inventive concept may not be limited thereto. The lower semiconductor chip 130 and the upper semiconductor chip 140a or 140b may be, for example, a volatile memory device (e.g., a dynamic random access memory (DRAM) and a static RAM (SRAM)), a nonvolatile memory device (e.g., FLASH memory device), a photoelectron device, a logic device, a communication device, a digital signal processor (DSP), or a system-on-chip (SOC).

The lower semiconductor chip 130 may be electrically connected to the ground terminal 150g using, for example, the chip mounting solder ball 132 and the ground line 112g of the lower wiring board 110. The upper semiconductor chip 140a or 140b may be electrically connected to the ground terminal 150g using, for example, a ground bonding wire 142gw and the ground line 122g of the upper wiring board 120. The above-mentioned connections allow for the reduction of electromagnetic interference in the semiconductor package 200. In other words, electromagnetic interference in the lower and upper semiconductor chips 130, 140a, and 140b can be suppressed by the ground line 112g, the ground terminal 150g, and the shielding member 160 electrically connected to the lower and upper semiconductor chips 130, 140a, and 140b. In addition, electromagnetic interference from the exterior can be prevented by the shielding member 160 being in direct contact with the ground line 112g and/or the ground terminal 150g.

The shielding member 160 may be shaped, for example, like a can and include a metal layer or a soft magnetic material. In the case in which the shielding member 160 is formed of a metal layer, the shielding member 160 may be formed, for example, using an electroplating technique. In an example embodiment, the shielding member 160 may be, for example, in direct contact with the ground terminal 150g through the metal layer formed by the electroplating technique. Alternatively, in the case in which the shielding member 160 is a can formed of a soft magnetic material, the shielding member 160 may include, for example, an adhesion layer 162, a soft magnetic layer 164 and a metal layer 166, and the adhesion layer 162 may include, for example, a conductive material. In this case, the shielding member 160 may be, for example, in direct contact with the ground terminal 150g through the adhesion layer 162 including the conductive material.

The soft magnetic material may be, for example, a soft magnetic metal powder or a soft magnetic alloy powder. The soft magnetic material may include, for example, a ferrite material exhibiting high resistivity and low saturation magnetization. In an example embodiment, the ferrite material may include, for example, iron oxides and at least one metal. The metal constituting the ferrite material in conjunction with the iron oxides may include, for example, one selected from the group consisting of nickel, zinc, manganese, cobalt, magnesium, aluminum, barium, copper, iron, or any combination thereof.

The semiconductor package 200 may include, for example, at least one package mounting solder ball 118 provided on a bottom surface of the lower wiring board 110. The package mounting solder ball 118 may be, for example, used to mount and electrically connect the semiconductor package 200 to a mother board.

The semiconductor package 200 may further include, for example, a heat dissipating member 170 provided on the shielding member 160. The heat dissipating member 170 may be, for example, a heat slug. The heat dissipating member 170 may be provided on the shielding member 160 to emit heat generated from the semiconductor package 200 to the exterior. As shown, the heat dissipating member 170 may be, for example, in direct contact with the shielding member 160. Alternatively, the heat dissipating member 170 may be provided, for example, spaced apart from the shielding member 160 by a predetermined interval.

According to an example embodiment of the inventive concept, the semiconductor package may include the shielding member covering the exterior thereof, thereby reducing effectively internal or external electromagnetic interference of the semiconductor package. This allows the operational reliability of the semiconductor package to be increased.

Furthermore, according to an example embodiment of the inventive concept, the semiconductor package may include a shielding member including a soft magnetic material and a heat dissipating member on a shielding member, and this allows the signal integrity and power of the semiconductor package to be increased and emit heat therein effectively. Accordingly, it is possible to provide a semiconductor package, which may be prevented from malfunctioning.

Figure 3:
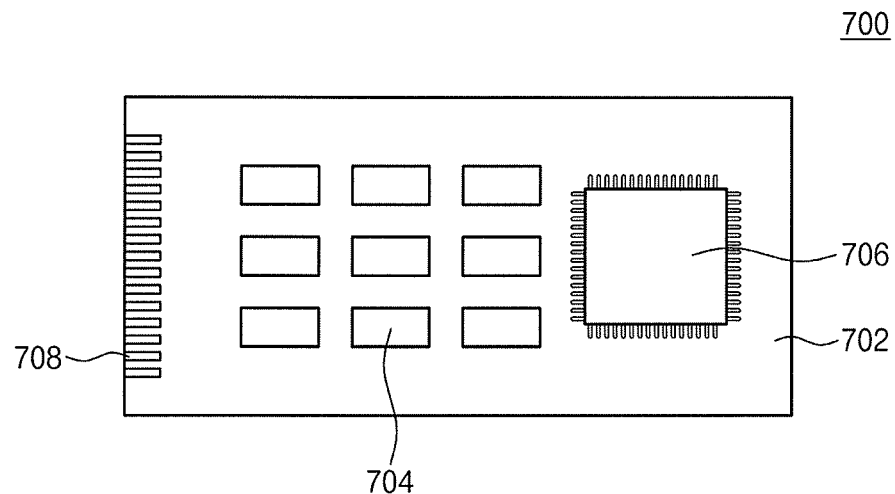

FIG. 3 is a plan view illustrating a package module according to an example embodiment of the inventive concept.

Referring to FIG. 3, a package module 700 may include, for example, a module substrate 702, which may be provided with at least one external connection terminal 708. The package module 700 may further include, for example, at least one semiconductor chip 704 and at least one semiconductor package 706 (for example, of quad-flat-package (QFP) structure) mounted on the module substrate 702. The semiconductor package 706 may include, for example, one of the semiconductor packages according to an example embodiment of the inventive concept. The package module 700 may be electrically connected to an external electronic device via, for example, the external connection terminal 708.

Figure 4:
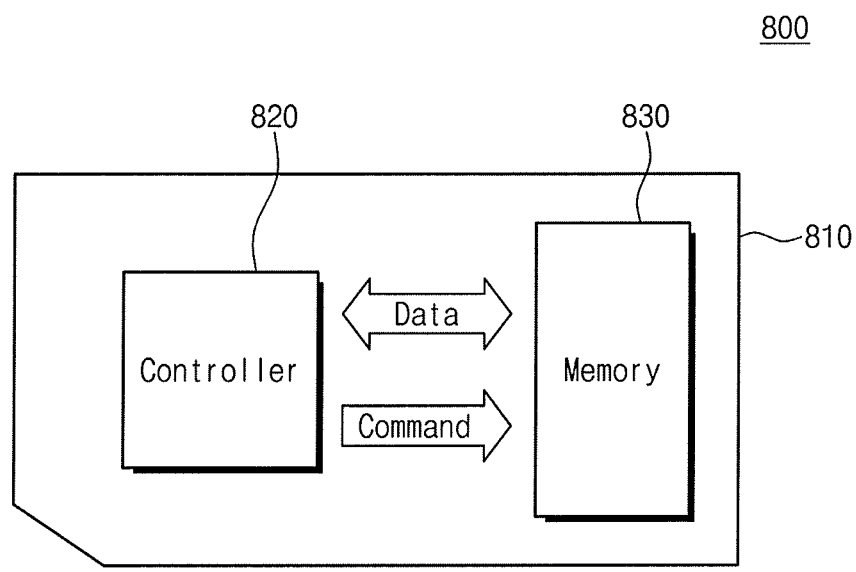

FIG. 4 is a block diagram illustrating a memory card in accordance with an example embodiment of the inventive concept.

Referring to FIG. 4, a memory card 800 may include, for example, a controller 820 and a memory 830 in a housing 810. The controller 820 and the memory 830 may exchange an electric signal with each other. For example, the memory 830 and the controller 820 may exchange data with each other according to a command of the controller 820. Thus, the memory card 800 may store data in the memory 830 or may output data from the memory 830.

The controller 820 and/or the memory 830 may include, for example, at least one of semiconductor packages in accordance with an example embodiment of the inventive concept. For example, the controller 820 may include a system in package, and the memory 830 may include a multichip package. The controller 820 and/or the memory 830 may be provided in a stacked package type (600 of FIG. 1 or 2). The memory card 800 may be used as a data storage medium for various portable devices. For example, the memory card 800 may include a multi media card (MMC) or a secure digital (SD) card.

Figure 5:
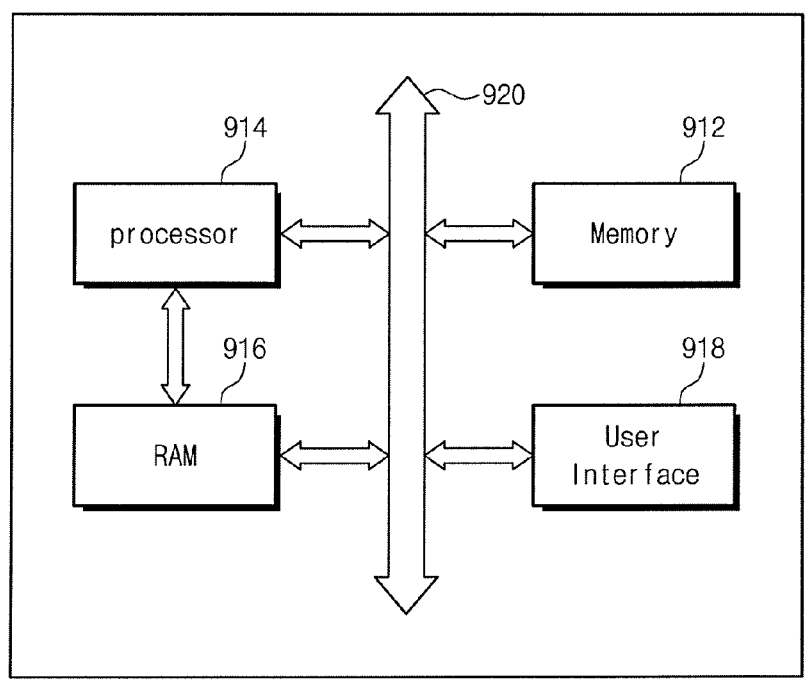

FIG. 5 is a block diagram illustrating an electronic system in accordance with an example embodiment of the inventive concept.

Referring to FIG. 5, an electronic system 900 may include, for example, at least one of semiconductor packages in accordance with an embodiment of the inventive concept. The electronic system 900 may include, for example, a mobile device or a computer. For example, the electronic system 900 may include a memory system 912, a processor 914, a RAM 916, and a user interface 918 that can exchange data with one another using a bus 920. The processor 914 may execute a program and may control the electronic system 900. The RAM 916 may be used as an operation memory of the processor 914. For example, the processor 914 and the RAM 916 may include a semiconductor package in accordance with an example embodiment of the inventive concept. For example, the processor 914 and the RAM 916 may be included in one package. The user interface 918 may be used to input data in the electronic system 900 or to output data from the electronic system 900. The memory system 912 may store a code for an operation of the processor 914, data processed by the processor 914, or data input from the outside. The memory system 912 may include, for example, a controller and a memory, and may be the same as the memory card 800 of FIG. 4.

Figure 6:
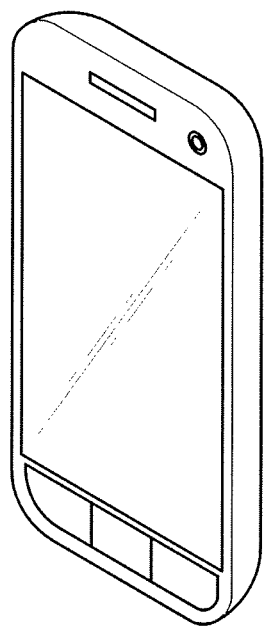

The electronic system 900 may be applied to various electronic devices. FIG. 6 illustrates an example in which the electronic system 900 is applied to a mobile phone 1000. Alternatively, in an example embodiment, the electronic system 900 may be applied to a portable notebook, a MP3 player, a navigation system, a solid state disk (SSD), a vehicle, or home appliances.

According to an example embodiment of the inventive concept, the semiconductor package may be configured to include the shielding member covering the exterior thereof, thereby reducing effectively internal or external electromagnetic interference of the semiconductor package. This allows the operational reliability of the semiconductor package to be increased.

In addition, according to an example embodiment of the inventive concept, the semiconductor package may be configured to include a shielding member including a soft magnetic material and a heat dissipating member on a shielding member, and this allows the signal integrity and power of the semiconductor package to be increased and emit heat therein effectively. Accordingly, it is possible to provide a semiconductor package, which may be prevented from malfunctioning.

Having described example embodiments of the inventive concept, it is further noted that it is readily apparent to those of ordinary skill in the art that various modifications may be made without departing from the spirit and scope of the invention which is defined by the metes and bounds of the appended claims.

What is claimed is:
1. A semiconductor package, comprising:
a first package including a first wiring board and at least one first semiconductor chip mounted on the first wiring board;
a second package stacked on the first package, wherein the second package includes a second wiring board and at least one second semiconductor chip mounted on the second wiring board;
at least one connection terminal connecting a plurality of signal lines, which are disposed in the first and second wiring boards, respectively, with each other, and thereby electrically connecting the first package to the second package;
at least one ground terminal connecting a plurality of ground lines, which are disposed in the first and second wiring boards, respectively, with each other, wherein the at least one ground terminal includes a side surface; and a shielding member covering a top surface and a side surface of a structure including the first and second packages and wherein the shielding member is disposed on the at least one ground terminal.

2. The semiconductor package of claim 1, wherein the first and second packages have a same occupying area, in a plan view.

3. The semiconductor package of claim 1, wherein the ground lines of the first and second wiring boards are exposed at outer edges of the first and second wiring boards, respectively, and wherein the ground lines of the first and second wiring boards are in direct contact with the shielding member.

4. The semiconductor package of claim 1, wherein the shielding member is a metal layer.

5. The semiconductor package of claim 1, wherein the shielding member comprises a soft magnetic material.

6. The semiconductor package of claim 5, wherein the shielding member comprises an adhesion layer, a soft magnetic layer, and a metal layer, and wherein the adhesion layer comprises a conductive material.

7. The semiconductor package of claim 5, wherein the soft magnetic material comprises iron oxides and one of nickel, zinc, manganese, cobalt, magnesium, aluminum, barium, copper, iron, or any combination thereof.

8. The semiconductor package of claim 1, wherein the at least one connection terminal is in a form of a solder ball, and
wherein the at least one ground terminal is in a form of a solder ball shaped substantially the same as a partial structure of the solder ball of the at least one connection terminal along a direction perpendicular to a surface of the first wiring board.

9. The semiconductor package of claim 1, further comprising a first molding layer covering a top surface of the first wiring board,
wherein the at least one connection terminal is shaped like a pillar and penetrates the first molding layer, and
wherein the at least one ground terminal is shaped like a pillar and penetrates the first molding layer and is exposed at the outer edge between the first and second wiring boards.

10. The semiconductor package of claim 9, further comprising an adhesion layer interposed between the first package and the second package.

11. The semiconductor package of claim 1, further comprising a second molding layer covering a top surface of the second wiring board.

12. The semiconductor package of claim 1, further comprising at least one solder ball disposed on a bottom surface of the first wiring board.

13. The semiconductor package of claim 1, further comprising a heat dissipating member on the shielding member.

14. The semiconductor package of claim 1, wherein the side surface of the at least one ground terminal is exposed at an outer edge between the first and second wiring boards and wherein the shielding member is in direct contact with the at least one ground terminal.

15. A semiconductor package, comprising:
a first package including a first wiring board and at least one first semiconductor chip mounted on the first wiring board;
a second package stacked on the first package, wherein the second package includes a second wiring board and at least one second semiconductor chip mounted on the second wiring board;

at least one ground terminal connecting a plurality of ground lines, which are disposed in the first and second wiring boards, respectively, with each other, and wherein the at least one ground terminal includes a side surface exposed at an outer edge between the first and second wiring boards; and a shielding member covering a top surface and a side surface of a structure including the first and second packages and wherein the shielding member is in direct contact with the at least one ground terminal.

16. The semiconductor package of claim 15, wherein the ground lines of the first and second wiring boards are exposed at outer edges of the first and second wiring boards, respectively, and wherein the ground lines of the first and second wiring boards are in direct contact with the shielding member.

17. A semiconductor package, comprising:
a first package including a lower wiring board and at least one first semiconductor chip mounted on and electrically connected to the lower wiring board via a chip mounting solder ball and an underfill, wherein the lower wiring board includes a signal line and a ground line;
a second package stacked on the first package, wherein the second package includes an upper wiring board and at least one second semiconductor chip mounted on and electrically connected to the upper wiring board by a bonding wire and an adhesion layer disposed between the at least one second semiconductor chip and the upper wiring board, wherein the upper wiring board includes a signal line and a ground line;
at least one connection terminal disposed between the lower and upper wiring boards which connects the signal line of the lower wiring board with the signal line of the upper wiring board;
at least one ground terminal disposed between the lower and upper wiring boards which connects the ground line of the lower wiring board with the ground line of the upper wiring board, wherein the at least one first semiconductor chip is electrically connected to the ground terminal via the chip mounting solder ball and the ground line of the lower wiring board and wherein the at least one second semiconductor chip is electrically connected to the at least one ground terminal via a ground bonding wire and the ground line of the upper wiring board; and
a shielding member covering a top surface and a side surface of a structure including the first and second packages, wherein the shielding member is disposed on a side of the at least one ground terminal.

18. The semiconductor package of claim 17, wherein a side surface of the at least one ground terminal is outwardly exposed at an outer edge between the lower and upper wiring boards, wherein the shielding member is in direct contact with the exposed side surface of the at least one ground terminal and wherein at least one of the ground lines of the lower wiring board and the upper wiring board is in direct contact with the shielding member.

19. The semiconductor package of claim 17, further comprising a heat dissipating member configured to emit heat generated from the semiconductor package to an exterior of the semiconductor package, wherein the heat dissipating member is disposed directly on the shielding member.

20. The semiconductor package of claim 17, further comprising:
a lower molding layer covering the lower wiring board and the at least one first semiconductor chip mounted on the lower wiring board; and an upper molding layer disposed on the upper wiring board and covered by the shielding member,
wherein the lower and upper molding layers each include an epoxy molding compound (EMC).

* * * * *